Nov. 14, 1967 G. R. ANTELL 3,352,725

METHOD OF FORMING A GALLIUM ARSENIDE TRANSISTOR BY DIFFUSION

Filed June 28, 1965

Inventor
GEORGE RICHARD ANTELL
By Percy P. Lantzy
Attorney

United States Patent Office 3,352,725

Patented Nov. 14, 1967

3,352,725

METHOD OF FORMING A GALLIUM ARSENIDE TRANSISTOR BY DIFFUSION

George Richard Antell, London, England, assignor to International Standard Electric Corporation, New York, N.Y., a corporation of Delaware Filed June 28, 1965, Ser. No. 467,361
Claims priority, application Great Britain, July 14, 1964, 28,953/64
7 Claims. (Cl. 148—186)

This invention relates to the manufacture of gallium arsenide transistors.

According to the invention there is provided a method of manufacturing a gallium arsenide transistor which includes the steps of diffusing zinc or cadmium into a body of N type gallium arsenide to form a P type base region, and diffusing silicon under arsenic pressure into part of the base region to from an N type emitter region.

A preferred embodiment of the invention will now be described with reference to the accompanying drawings, in which:

FIGS. 1 to 12 show successive stages in the manufacture of a diffused gallium arsenide transistor.

A slice 1 (FIG. 1) of N type gallium arsenide, of about 0.1 ohm cm., is provided with a layer 2 (FIG. 2) of silica ($SiO_2$) by sputtering silicon on to the slice 1 in an oxidising atmosphere, the layer 2 being about 0.1$\mu$ thick.

Figure 1:
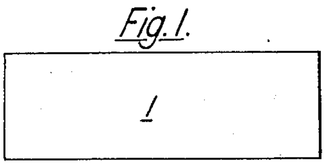
Figure 2:
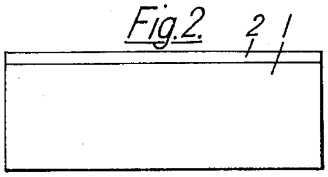
Figure 3:
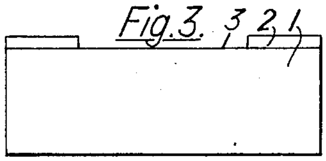
Figure 4:
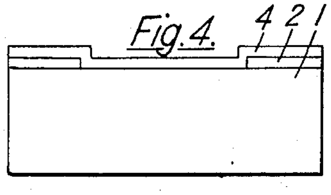
Figure 5:
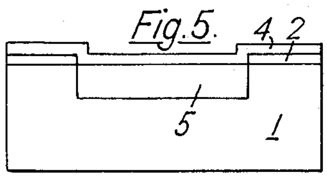
Figure 6:
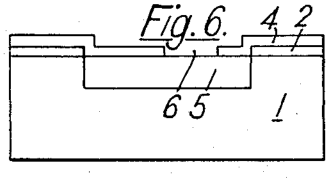

A portion of the layer 2 is removed by known techniques of masking and etching to define a base window (FIG. 3).

A layer 4 (FIG. 4) is provided over the gallium arsenide surface exposed through the window 3 and over the remaining silica layer 2. The layer 4 consists of a mixture of silica and zinc oxide (ZnO) or cadmium oxide (CdO), and is obtained by sputtering in an oxidising atmosphere using a silicon electrode on which is placed the requisite amount of zinc or cadmium.

This slice is then heated in a hydrogen atmosphere or in an evacuated capsule at 1000° C. for a sufficient time for the zinc or cadmium atoms to diffuse into the slice 1 to form a P type base region 5 (FIG. 5) A junction depth of 1.5 to 2$\mu$ requires a diffusion time of 5 hours or more.

When this diffusion process is completed, the layer 4 is of silica, and an emitter window 6 is formed in the layer 4 (FIG. 6) by masking the etching, as for the base window 3.

Figure 7:
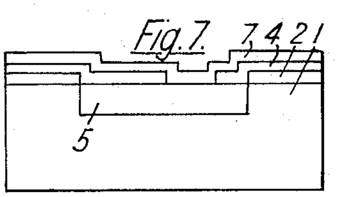

As shown in FIG. 7, a layer 7 of N type silicon is sputtered in an argon atmosphere over the surface of the slice 1 and contacting the gallium arsenide through the emitter window 6.

Figure 8:
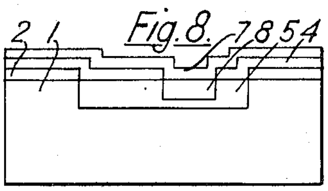
Figure 9:
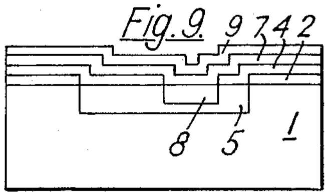

Silicon from the layer 7 is now diffused in through the emitter window 6 under an arsenic pressure, and this second diffusion results in the formation of an N type emitter region 8 (FIG. 8).

The diffusion is carried out be sealing the slice in a quartz ampoule together with a weighed amount of deoxidised arsenic, and heating.

The arsenic pressure substantially increases the diffusion rate of the silicon into the gallium arsenide. Diffusion only takes place where the silicon is in contact with the gallium arsenide surface. The remainder of the silicon layer 7 does not diffuse in due to the masking action of the silica layer 4.

As an example, with a collector junction depth of about 2$\mu$ it is possible to diffuse in silicon to about 1.2 to 1.3$\mu$ in half an hour at 1000° C. in an atmosphere containing about 0.3 mg. of arsenic per cm.$^3$.

Alternatively the arsenic pressure may be obtained by including the arsenic with the silicon layer 7.

Figure 10:
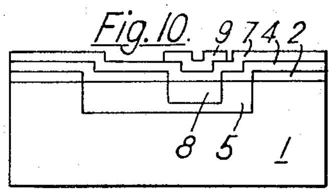
Figure 11:
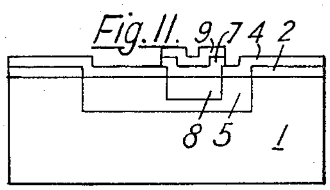
Figure 12:
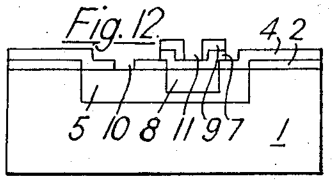

When the second diffusion is completed, a layer 9 (FIG. 9) of silica is sputtered over the silicon layer 7, and this layer 9 is then removed by masking and etching except over the area of the emitter region 8 (FIG. 10).

The area of the silicon layer 7 now exposed by the removal of the silica layer 9 is removed except under the remainder of the silica layer 9 (FIG. 11) by the action of chlorine, bromine or iodine at temperatures below 800° C. or by soaking for about 30 secs. in a solution of 1 part (by volume) of $Br_2I$ 1 part of HF in 8 parts of methanol which attacks the silicon layer very much faster than the silica layer underneath. Alternatively the silicon is converted to silica by heating in an oxidising atmosphere; the thickness of the silica layer 9 over the emitter region 8 is sufficient to protect the underlaying silicon from oxidation.

Windows 10 and 11 (FIG. 12) are provided respectively through the silica layer 4 overlying the base region 3 and through the silica layer 9 overlying the emitter region 8 for the establishment of base and emitter contacts, the collector contact being made to a convenient area on the slice 1.

The emitter contact is made to the silicon layer 7 which has the advantage of giving a very heavily doped N type contact and also makes alloying of a contact easier by effectively increasing the depth of the emitter junction.

It is to be understood that the foregoing description of specific examples of this invention is made by way of example only and is not to be considered as a limitation on its scope.

What I claim is:

1. A method of manufacturing a gallium arsenide transistor which includes the steps of diffusion a P type material into a body of N type gallium arsenide to form a P type base region, and diffusing silicon under arsenic pressure into part of the base region to form an N type emitter region.

2. A method as claimed in claim 1 in which the emitter region is formed by depositing a layer of silicon on the surface of the base region, sealing the body in a container with deoxidised arsenic, and heating.

3. A method as claimed in claim 2 in which the silicon layer is formed by sputtering in an inert atmosphere.

4. A method as claimed in claim 2 in which the base region is formed by diffusion from a surface layer of silica and zinc oxide.

5. A method as claimed in claim 4 in which the surface layer is formed by sputtering in an oxidising atmosphere from a silicon electrode having zinc thereon.

6. A method as claimed in claim 2 in which the base region is formed by diffusion from a surface layer of silica and cadmium oxide.

7. A method as claimed in claim 4 in which the surface layer is formed by sputtering in an oxidizing atmosphere from a silicon electrode having cadmium thereon.

References Cited

UNITED STATES PATENTS

| | | | |
|---|---|---|---|
| 3,401,508 | 6/1962 | Henkel et al. | |
| 3,189,800 | 6/1965 | Strull | 148—188 X |
| 3,255,056 | 6/1966 | Flatley | 148—187 |
| 3,313,663 | 4/1967 | Yeh et al. | 148—190 X |

HYLAND BIZOT, *Primary Examiner.*